(12) United States Patent
Brandl et al.

(10) Patent No.: US 9,183,125 B2
(45) Date of Patent: Nov. 10, 2015

(54) DDR RECEIVER ENABLE CYCLE TRAINING

(75) Inventors: Kevin M. Brandl, Austin, TX (US);
Oswin E. Housty, Austin, TX (US);
Edoardo Prete, Arlington, MA (US);
Gerald Talbot, Concord, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 978 days.

(21) Appl. No.: 13/330,518

(22) Filed: Dec. 19, 2011

(65) Prior Publication Data
US 2013/0159615 A1    Jun. 20, 2013

(51) Int. Cl.
*G11C 7/22* (2006.01)
*G06F 12/00* (2006.01)
*G11C 8/18* (2006.01)
*G06F 13/16* (2006.01)

(52) U.S. Cl.
CPC ............... *G06F 12/00* (2013.01); *G06F 13/16* (2013.01); *G11C 7/222* (2013.01); *G11C 8/18* (2013.01)

(58) Field of Classification Search
CPC .................................. G11C 7/22; G11C 7/222
USPC ................... 365/193, 233.1, 233.12, 233.13; 702/106
See application file for complete search history.

(56) References Cited

U.S. PATENT DOCUMENTS

| 8,081,527 | B1* | 12/2011 | Venkataraman et al. | 365/194 |
| 2006/0052961 | A1* | 3/2006 | Best | 702/106 |
| 2012/0242385 | A1* | 9/2012 | Tokuhiro | 327/158 |
| 2014/0177377 | A1* | 6/2014 | Kumar et al. | 365/233.12 |

* cited by examiner

*Primary Examiner* — Hoai V Ho
*Assistant Examiner* — Jay Radke

(57) ABSTRACT

A method is provided for sampling a data strobe signal of a memory cycle and determining a receiver enable phase based upon the data strobe signal. The method also includes performing a memory write cycle and a subsequent read cycle and training a read data strobe cycle at a one-quarter memory clock periodic offset. The method also includes determining a correct receiver enable delay in response to a successful read data strobe training cycle. Computer readable storage media are also provided. An apparatus is provided that includes a communication interface portion that is coupled to a memory portion and to a processing device. The apparatus also includes a first circuit portion, coupled to the communication interface portion. The first circuit portion monitors memory cycles on the communication interface portion, determines a receiver enable cycle phase and train a receiver enable cycle without using receiver enable seed.

24 Claims, 4 Drawing Sheets

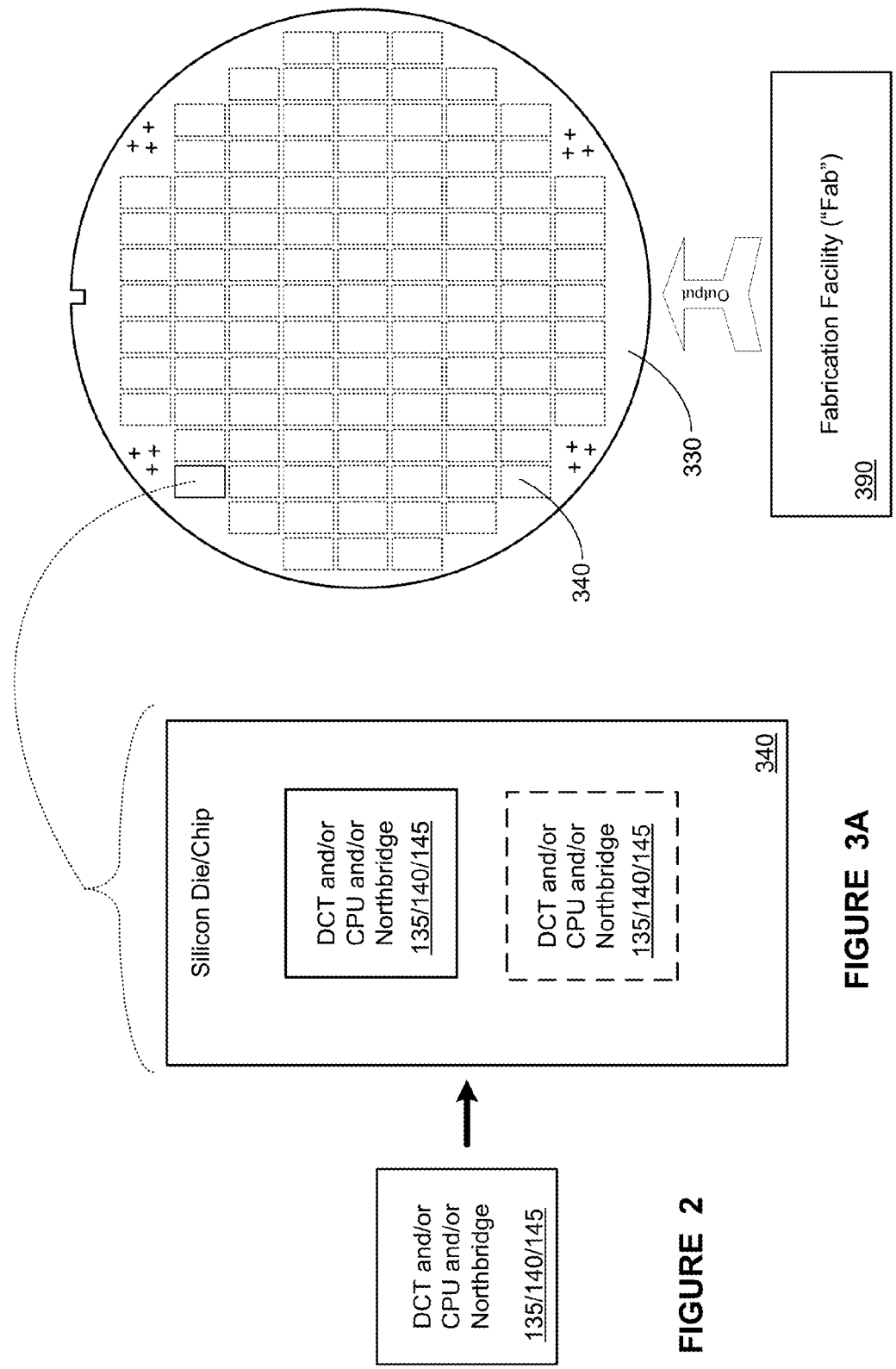

DDR RECEIVER ENABLE CYCLE TRAINING

BACKGROUND

1. Field of the Invention

Embodiments presented herein relate generally to computing systems, and, more particularly, to a method for receiver enable cycle training for double data rate (DDR) memory.

2. Description of Related Art

Electrical circuits and devices that execute instructions and process data have evolved becoming faster and more complex. With the increased speed and complexity of electrical circuits and data processors, DDR memory training has become more problematic, particularly for receiver enable cycle training. As technologies for electrical circuits and processing devices have progressed, there has developed a greater need for efficiency, reliability and stability, particularly in the area of DDR memory receiver enable training. However, considerations for algorithm processing, overall system boot-up performance, as well as system complexity introduce substantial barriers to efficiently training receiver enable cycles in DDR memory systems. The areas of training to the correct cycle and training to the correct phase, variances in hardware such as processor die, processor packages, memory bus layout and memory itself are particularly problematic, for example, in systems that utilize and/or support different types of interchangeable microprocessors or DDR RAM such as dynamic RAM (DRAM).

Typically, modern implementations for receiver enable cycle in DDR systems, as noted above, have taken the approach of solving these training issues in one of two ways. One way is to allow a computer system's basic input/output system (BIOS) to train the receiver enable (RxEn) delay after comparing a series of memory write and read cycles. However, this approach has undesirable drawbacks. For example, this approach relies upon simple data patterns in order to infer the data strobe position and thus cannot adequately compensate for signaling effects such as data strobe jitter which leads to undesired RxEn settings. This approach is also very time consuming. A second approach uses a hardware phase recovery engine (PRE) in conjunction with a software algorithm to sample the signal phase over a number of data strobe pulses driven by the DRAM in response to a series of host controller read commands. This second approach, however, relies upon an input such as an estimate of the actual RxEn cycle and phase delay for the configuration (e.g., an RxEn seed). That is, the RxEn seed must be within a theoretical plus-or-minus ("±") one-half of the memory clock range of the actual value for the RxEn delay to be trained successfully. If the RxEn seed is outside of the required range, the training result aliases to an incorrect RxEn cycle because the incoming data strobe pulses are periodic. With an improper RxEn cycle, subsequent read data transfers would be framed incorrectly and be corrupted.

Embodiments presented herein eliminate or alleviate the problems inherent in the state of the art described above.

SUMMARY OF EMBODIMENTS

In one aspect of the present invention, a method is provided. The method includes sampling a data strobe signal for a plurality of memory cycles and determining a receiver enable phase based upon the sampled data strobe signal. The method also includes performing at least one memory write cycle and at least one memory read cycle to read data written by the at least one memory write cycle at a selected memory clock frequency. The method also includes training at least one read data strobe cycle associated with the memory read cycle, wherein training is performed at a one-quarter memory clock periodic offset from an optimal receiver enable delay phase and determining a correct receiver enable delay in response to a successful read data strobe training cycle.

In another aspect of the invention, a non-transitory, computer-readable storage device encoded with data that, when executed by a processing device, adapts the processing device to perform a method, is provided. The method includes sampling a data strobe signal for a plurality of memory cycles and determining a receiver enable phase based upon the sampled data strobe signal. The method also includes performing at least one memory write cycle and at least one memory read cycle to read data written by the at least one memory write cycle at a selected memory clock frequency. The method also includes training at least one read data strobe cycle associated with the memory read cycle, wherein training is performed at a one-quarter memory clock periodic offset from an optimal receiver enable delay phase and determining a correct receiver enable delay in response to a successful read data strobe training cycle.

In yet another aspect of the invention, a circuit is provided. The circuit includes at last at least one communication interface portion communicatively coupled to at least one memory portion and to a processing device. The circuit also includes a first circuit portion, communicatively coupled to the at least one communication interface portion. The first circuit portion is adapted to monitor a plurality of memory cycles on the at least one communication interface portion, determine a receiver enable cycle phase, and train a receiver enable cycle without using receiver enable seed.

BRIEF DESCRIPTION OF THE DRAWINGS

The embodiments herein may be understood by reference to the following description taken in conjunction with the accompanying drawings, in which the leftmost significant digit(s) in the reference numerals denote(s) the first figure in which the respective reference numerals appear, and in which:

FIG. 2 shows a simplified block diagram of a circuit that includes a phase recovery engine and/or a central processing unit (CPU) and/or a northbridge, according to one embodiment;

FIG. 3A provides a representation of a silicon die/chip that includes one or more circuits as shown in FIG. 2, according to one embodiment;

FIG. 3B provides a representation of a silicon wafer which includes one or more die/chips that may be produced in a fabrication facility, according to one embodiment;

Figure 1:
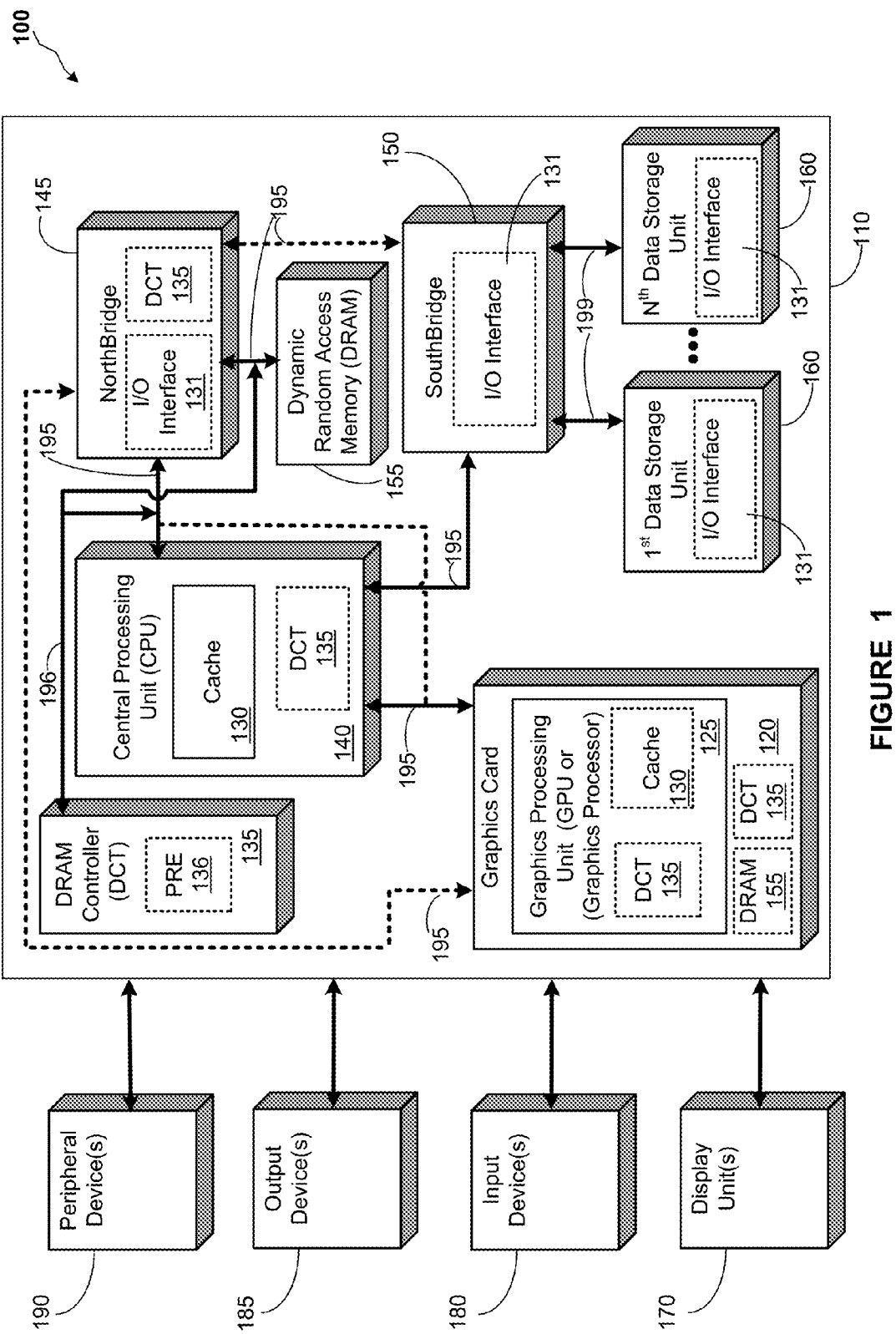
FIG. 1 schematically illustrates a simplified block diagram of a computer system, according to one embodiment.

While the embodiments herein are susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the scope of the invention as defined by the appended claims.

DETAILED DESCRIPTION

Illustrative embodiments of the instant application are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and/or business-related constraints, which may vary from one implementation to another. Moreover, it will be appreciated that such a development effort might be complex and time-consuming, but may nevertheless be a routine undertaking for those of ordinary skill in the art having the benefit of this disclosure.

Embodiments of the present application will now be described with reference to the attached figures. Various structures, connections, systems and devices are schematically depicted in the drawings for purposes of explanation only and so as to not obscure the disclosed subject matter with details that are well known to those skilled in the art. Nevertheless, the attached drawings are included to describe and explain illustrative examples of the present embodiments. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used herein, the terms "substantially" and "approximately" may mean within 85%, 90%, 95%, 98% and/or 99%. In some cases, as would be understood by a person of ordinary skill in the art, the terms "substantially" and "approximately" may indicate that differences, while perceptible, may be negligent or be small enough to be ignored. Additionally, the term "approximately," when used in the context of one value being approximately equal to another, may mean that the values are "about" equal to each other. For example, when measured, the values may be close enough to be determined as equal by one of ordinary skill in the art.

As used herein, the suffixes "#", "_b" and "_n" (or "'b" and "n") denote a signal that is active-low (i.e., the signal is activated or enabled when a logical '0' is applied to the signal). Signals not having these suffixes may be active-high (i.e., the signal is activated or enabled when a logical '1' is applied to the signal). While various embodiments and Figures herein are described in terms active-high and active-low signals, it is noted that such descriptions are for illustrative purposes of various embodiments and that alternate configurations are contemplated in other embodiments not explicitly described in this disclosure.

As used herein, the term "rich", as used to describe data patterns, refers to a pattern of data that can be differentiated bit-to-bit, byte-to-byte, beat-to-beat, line-to-line, etc. In other words, a rich data pattern allows a designer, tester, phase recovery engine, CPU or other computer component to detect bit transitions on a bus, as well as different bytes of data on a bus because the data pattern can be differentiated bit-to-bit and byte-to-byte etc.

Embodiments presented herein relate to receiver enable (RxEn) training for DDR memories. DDR memories may be used in computer systems in conjunction with processors such as, but not limited to, central processing units, graphics processing units, and/or the like. DDR memory RxEn training may be performed at system boot (e.g., when booting a computer such as computer system 100, described below) using a phase recovery engine (PRE), a host controller and/or the like. RxEn training may be used to synchronize the phase and signal delay of the receiver enable (RxEn). It is noted that the RxEn training may occur on a byte lane by byte lane basis, on a rank by rank basis, on a channel by channel basis, or across all byte lanes, in various embodiments. In alternate embodiments, other groupings of data (e.g., per bit) may be used. It is also noted that while the embodiments described herein may be referred to in terms of memory cycles, read cycles and/or write cycles, the described embodiments are not thus limited and may be applied to various memory cycles equally.

Turning now to FIG. 1, a block diagram of an exemplary computer system 100, in accordance with an embodiment of the present application, is illustrated. In various embodiments the computer system 100 may be a personal computer, a laptop computer, a handheld computer, a tablet computer, a mobile device, a telephone, a personal data assistant ("PDA"), a server, a mainframe, a work terminal, a music player, and/or the like. The computer system includes a main structure 110 which may be a computer motherboard, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. In one embodiment, the graphics card 120 may be a Radeon™ graphics card from Advanced Micro Devices ("AMD") or any other graphics card using memory, in alternate embodiments. The graphics card 120 may, in different embodiments, be connected on a Peripheral Component Interconnect "(PCI") Bus (not shown), PCI-Express Bus (not shown) an Accelerated Graphics Port ("AGP") Bus (also not shown), or any other computer system connection. It should be noted that embodiments of the present application are not limited by the connectivity of the graphics card 120 to the main computer structure 110. In one embodiment, the computer system 100 runs an operating system such as Linux, UNIX, Windows, Mac OS, and/or the like. In one or more embodiments, the computer system 100 may include one or more system registers (not shown) adapted to store values used by the computer system 100 during various operations.

In one embodiment, the graphics card 120 may contain a processing device such as a graphics processing unit (GPU) 125 used in processing graphics data. The GPU 125, in one embodiment, may include one or more embedded/non-embedded memories, such as one or more caches 130. The GPU caches 130 may be L1, L2, higher level, graphics specific/related, instruction, data and/or the like. In various embodiments, the embedded memory(ies) may be an embedded random access memory ("RAM"), an embedded static random access memory ("SRAM"), or an embedded dynamic random access memory ("DRAM"). In alternate embodiments, the memory(ies) may be on the graphics card 120 in addition to, or instead of, being embedded in the GPU 125, for example as DRAM 155 on the graphics card 120 as shown in FIG. 1. In various embodiments the graphics card 120 may be referred to as a circuit board or a printed circuit board or a daughter card or the like.

In one embodiment, the computer system 100 includes a processing device such as a central processing unit ("CPU") 140, which may be connected to a northbridge 145. In various embodiments, the CPU 140 may be a single- or multi-core processor, or may be a combination of one or more CPU cores and a GPU core on a single die/chip (such an AMD Fusion™ APU device). In one embodiment, the CPU 140 may include one or more cache memories 130, such as, but not limited to, L1, L2, level 3 or higher, data, instruction and/or other cache types. In one or more embodiments, the CPU 140 may be a pipe-lined processor. The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other computer system connection. For example, CPU 140, northbridge 145, GPU 125 may be included in a single package or as part of a single die or "chips" (not shown) or as a combination of packages. Alternative embodiments which alter the arrangement of various components illustrated as forming part of main structure 110 are also contemplated. In certain embodiments, the northbridge 145 may be coupled to a system RAM (or DRAM) 155; in other embodiments, the system RAM 155 may be coupled directly to the CPU 140. The system RAM 155 may be of any RAM type known in the art and may comprise one or more memory modules; the type of RAM 155 does not limit the embodiments of the present application. For example, the RAM 155 may include one or more DIMMs. As referred to in this description, a memory may be a type of RAM, a cache or any other data storage structure referred to herein.

In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have one or more I/O interfaces 131, in addition to any other I/O interfaces 131 elsewhere in the computer system 100. In various embodiments, the southbridge 150 may be connected to one or more data storage units 160 using a data connection or bus 199. The data storage units 160 may be hard drives, solid state drives, magnetic tape, or any other writable media used for storing data. In one embodiment, one or more of the data storage units may be USB storage units and the data connection 199 may be a USB bus/connection. Additionally, the data storage units 160 may contain one or more I/O interfaces 131. In various embodiments, the central processing unit 140, northbridge 145, southbridge 150, graphics processing unit 125, DRAM 155 and/or embedded RAM may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In one or more embodiments, the computer system 100 may include a DRAM controller (DCT) 135. In one embodiment, the DCT 135 may include a read-only memory (ROM) and/or one or more caches 130 as described above. For example, the DCT 135 may include an L1 cache and an L2 cache in some embodiments. The DCT 135 may comprise a silicon die/chip and include software, hardware or firmware components. In different embodiments, the DCT 135 may be packaged in any silicon die package or electronic component package as would be known to a person of ordinary skill in the art having the benefit of this disclosure. In alternate embodiments, the DCT 135 may be a circuit included in an existing computer component, such as, but not limited to, the CPU 140, the northbridge 145, the graphics card 120 and/or the GPU 125. In one embodiment, the DCT may be communicatively coupled to the CPU 140, the northbridge 145, the DRAM 155 and/or their respective connections 195 via DCT connection 196, as shown in FIG. 1. The DCT 135 may include a CPU interface associated with the connection 196.

The DCT 135 may be adapted to execute a DDR training algorithm and/or state machine within the CPU 140, in one or more embodiments and as discussed in further detail below, for example, to execute a DDR receiver enable training. In one embodiment, the DCT 135 may include a phase recovery engine (PRE) 136 adapted to interrogate a data signal or data strobe signal in order to determine the signal's phase. As used herein, the terms "DRAM controller" or "DCT" (e.g., the DCT 135) may be used to refer to the physical DCT chip or to DCT circuitry included in a computer component, to circuitry on the DCT 135 chip, or to the functionality implemented by the DCT. In accordance with one or more embodiments, the DCT may function as, and/or be referred to as, a processing device. In some embodiments, some combination of the GPU 125, the CPU 140, the DCT 135 and/or any hardware/software computer 100 units respectively associated therewith, may collectively function as, and/or be collectively referred to as, a processing device. For example, in one embodiment, the CPU 140 and the DCT 135, or the northbridge 145 and the DCT 135 and their respective interconnects may function as a processing device.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present application. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to corresponding physical digital media, a universal serial bus ("USB") device, Zip Drive, external floppy drive, external hard drive, phone and/or broadband modem, router/gateway, access point and/or the like. The input, output, display and peripheral devices/units described herein may have USB connections in some embodiments. To the extent certain exemplary aspects of the computer system 100 are not described herein, such exemplary aspects may or may not be included in various embodiments without limiting the spirit and scope of the embodiments of the present application as would be understood by one of skill in the art.

Turning now to FIG. 2, a block diagram of an exemplary DCT 135, CPU 140 and/or northbridge 145, in accordance with an embodiment of the present application, is illustrated. In one embodiment, the DCT 135, CPU 140 and/or northbridge 145 may contain one or more cache memories 130. The DCT 135, CPU 140 and/or northbridge 145, in one embodiment, may include L1, L2 or other level cache memories 130. In one embodiment, the DCT 135, CPU 140 and/or northbridge 145 may be adapted to execute a state machine and/or an algorithm in the to perform one or more types of DDR training (e.g., DDR receiver enable training) The one or more cache memories 130, such as those that may be included in the DCT 135, CPU 140 and/or northbridge 145 for example, may be adapted to store and/or facilitate execution of the training state machine and/or algorithm(s). To the extent certain exemplary aspects of the DCT 135, CPU 140 and/or northbridge 145 and/or one or more cache memories 130 are not described herein, such exemplary aspects may or may not be included in various embodiments without limiting the spirit and scope of the embodiments of the present application as would be understood by one of skill in the art.

Turning now to FIG. 3A, in one embodiment, the DCT 135, CPU 140 and/or northbridge 145 and the cache(s) 130 may reside on a silicon chips/die 340 and/or in the computer system 100 components such as those depicted in FIG. 1. The silicon chip(s) 340 may be housed on the motherboard (e.g., 110) or other structure of the computer system 100. In one or more embodiments, there may be more than one DCT 135, CPU 140 and/or northbridge 145 and/or cache memory 130 on each silicon chip/die 340. As discussed above, various embodiments of the DCT 135, CPU 140 and/or northbridge 145 may be used in a wide variety of electronic devices.

Turning now to FIG. 3B in accordance with one embodiment, and as described above, one or more of the DCT 135, CPU 140 and/or northbridge 145 may be included on the silicon die/chips 340 (or computer chip). The silicon die/chips 340 may contain one or more different configurations of the DCT 135, CPU 140 and/or northbridge 145. The silicon chips 340 may be produced on a silicon wafer 330 in a fabrication facility (or "fab") 390. That is, the silicon wafers 330 and the silicon die/chips 340 may be referred to as the output, or product of, the fab 390. The silicon die/chips 340 may be used in electronic devices, such as those described above in this disclosure.

Figure 4:
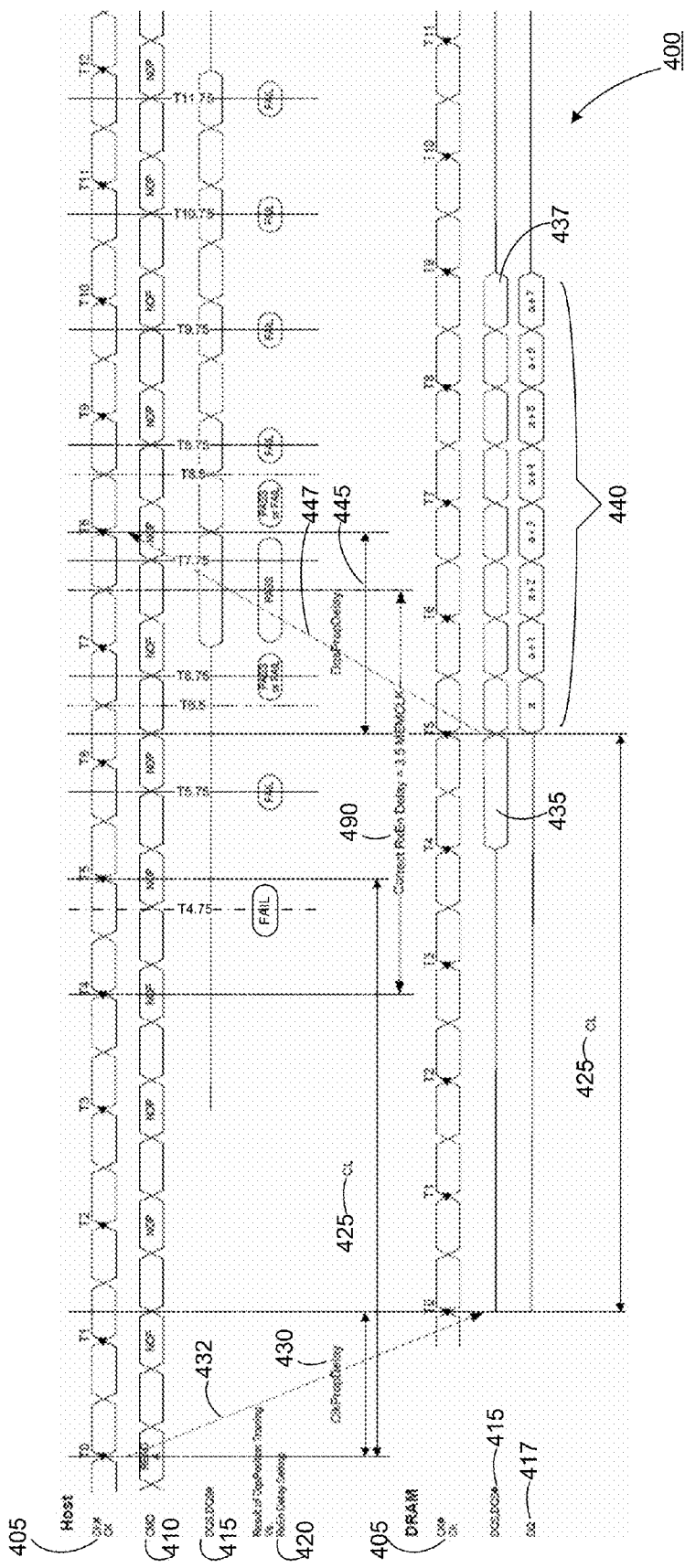
FIG. 4 illustrates a graphical representation of a timing diagram for DDR memory training, according to one embodiment.

Turning now to FIG. 4, a graphical representation of a timing diagram for DDR memory training in one or more embodiments, is shown. As depicted in FIG. 4, two groups of signals (i.e., signals from a host, such as a CPU 140 and/or DCT 135, and signals from a DRAM, such as DRAM 155) describe an exemplary DDR training embodiment for receiver enable training 400. As shown, the host signals may include a clock signal CK/CK#405 (CK), a command signal CMD 410, and data strobe signal DQS/DQS#415 (DQS). The DRAM signals may include the CK 405 and the DQS 415, as well as a data signal DQ 417. As shown, the CK 405 signal may repeatedly cycle, as clock signals are known to in the art, and may be referred to, at different points in time, as times T0 through Tn (in FIG. 4, n is 12). The time T0 may be the beginning of the clock cycle in which a command CMD 410 is issued, such as, but not limited to, a READ command. The commands CMD 410 may also be referred to as memory cycles. No Operation (NOP) commands may be issued on CMD 410 when no additional commands are required. The CK 405 may have a clock propagation delay 430 in one more embodiments that may be equal to any number or portions of CK 405 clock cycles. The propagation delay may be the time required for the CK 405 to propagate from the host (e.g., CPU 140 and/or DCT 135) to the DRAM (e.g., DRAM 155). In the exemplary embodiment show, the delay 430 is 1.25 CK 405 cycles. The arrival of the CK 405 at the DRAM is shown by arrow 432.

The READ command at time T0 on CMD 410, as well as other commands issued on CMD 410, may have command length. CL 425, which may be the number of CK 405 cycles required to complete the command. In the exemplary embodiment shown, the READ command length/cycle length CL 425 is five CK 405 cycles. After the CL 425, data 440 associated with the CMD 410 may be transmitted. As shown, the data 440 may be transmitted from the DRAM at the end of the CL 425. In some embodiments, the data 410 may comprise one bit, or more bits (e.g., bits a, a+1, a+2 . . . a+n), such nibbles, bytes, words, dwords, and/or the like. As illustrated, the exemplary memory READ cycle of FIG. 4 includes 8 bits of data, 'a' through 'a+7'. In one embodiment, the DQS 415 may operate at the same frequency as the CK 405, and the DQS#415 may operate at the same frequency as the CK 405 while out of phase by half of a CK 405 cycle. The DQS/DQS#415 may provide a reference for the data DQ 417, allowing a bit of the data DQ 417 to transmit at each transition of the DQS/DQS#415. In one embodiment, the DQS/DQS#415 may transition from low to high and from high to low (or vice versa) for each CK 405 cycle as illustrated. As shown, the DQS/DQS#415 may include a preamble 435 and strobe 437 portions. The preamble 435 may precede the strobes 437, and may be a full CK 405 cycle in length. In one or more embodiments, the center of the preamble 435 may be the location of the optimal receiver enable (RxEn) delay, as discussed below. When the data 440 is read back to the host, there may be a DQS propagation delay 445 that may be the time required for the DQS 415 to be transmitted from the DRAM to the host as shown by arrow 447.

When the READ CMD 410 data 440 is received at the host, it may be necessary in one or more embodiments to train the host (as the receiver of the data 440) to enable the receiving of the data 440. That is, the host (e.g., CPU 140 and/or DCT 135) may not know when the data 440 stream begins. The correct clock cycle at which the data 440 stream begins may be determined by finding the receiver enable (RxEn) delay 490. In one embodiment, the RxEn delay 490 may be characterized as the amount of time (e.g., measured in CK 405 cycles) from the end of the CL 425 to the center of the preamble (or one-half of a CK 405 cycle before the data 440 arrives at the host (e.g., CPU 140 and/or DCT 135)) plus one CK 405 cycle (to account for the DQS 415 preamble 435, in certain embodiments). It is contemplated that the RxEn delay 490 may be characterized differently in accordance with other embodiments depending on system architectures, timing protocols, implementation specific factors, and/or the like.

In one embodiment, the RxEn delay 490 may be found by training the DQS 415 at the host (e.g., CPU 140 and/or DCT 135). In some embodiments the DQS 415 training may include training the DQS 415 at a one-quarter memory clock period offset such that the DQS 415 is low (i.e., a logical "0") for the training. The one-quarter CK 405 offset from the trained RxEn phase is illustrated, for example, at times T5.75, T6.75, T7.75, T8.75, T9.75, T10.75, T11.75, etc. The result of the training cycle with respect to the DQS 415 positions at one-quarter CK 405 cycle offsets are shown in FIG. 4 as results 420. The results 420 may be determined by iterating or traversing the DQS 415 positions at one-quarter CK 405 offsets sequentially starting, for example, during the CK 405 cycle after the CL 425 (e.g., at T4.75 for a zero-delay system, or T5.75 in FIG. 4), or in some other fashion. For example, if it is determined that the theoretical or pre-calculated RxEn delay 490 is at time T8.75, the DQS 415 training may run the first training cycle and determine the result of a comparison between expected and actual data values at time T8.75 to determine if at time T8.75 the DQS 415 is properly trained. That is, if the actual cycle data at T8.75 matches the expected data, the training cycle passes; if not, the training cycle fails. If the training cycle fails, the next time trained may be determined as "T8.75+one CK 405 cycle", followed by "T8.75–one CK 405 cycle" in the event of another failed training cycle, followed by "T8.75+two CJK 405 cycles" in the event of another failed training cycle, followed by "T8.75–two CJK 405 cycles" in the event of another failed training cycle, and so on. In one embodiment, to determine that the proper/correct training cycle has been selected, the correct training cycle may be determined as the passing training cycle that is immediately or successively followed by a failing training cycle. That is, in certain circumstances, multiple times with one-quarter offsets (e.g., T6.75 and T7.75) may result in passing training cycles. In such cases, the last passing cycle in a sequence of passing cycles may be selected as the correct cycle, although it is contemplated that other passing cycles may be selected in alternate embodiments.

As shown in the exemplary embodiment depicted in FIG. 4, the correct training cycle was determined to be associated with T7.75 according to the training description(s) above. To determine the RxEn delay, the one-quarter CK 405 offset is removed, giving a time of T7.5. The time between the properly trained cycle and the end of the CL 425 is added to the delay, giving a delay time of 2.5 CK 405 cycles (T7.5−T5=2.5 CK 405 cycles). An extra CK 405 cycle is added to the delay to account for the preamble 437, giving a total RxEn delay 490 of 3.5 CK 405 cycles (2.5+1=3.5), as shown in FIG. 4. In one or more embodiments, each of the removing the one-quarter cycle offset, the determining the difference between the trained cycle and the CL 425, and the addition of the 1 cycle delay may be performed in any order, substantially concurrently, or a combination thereof.

Figure 5:
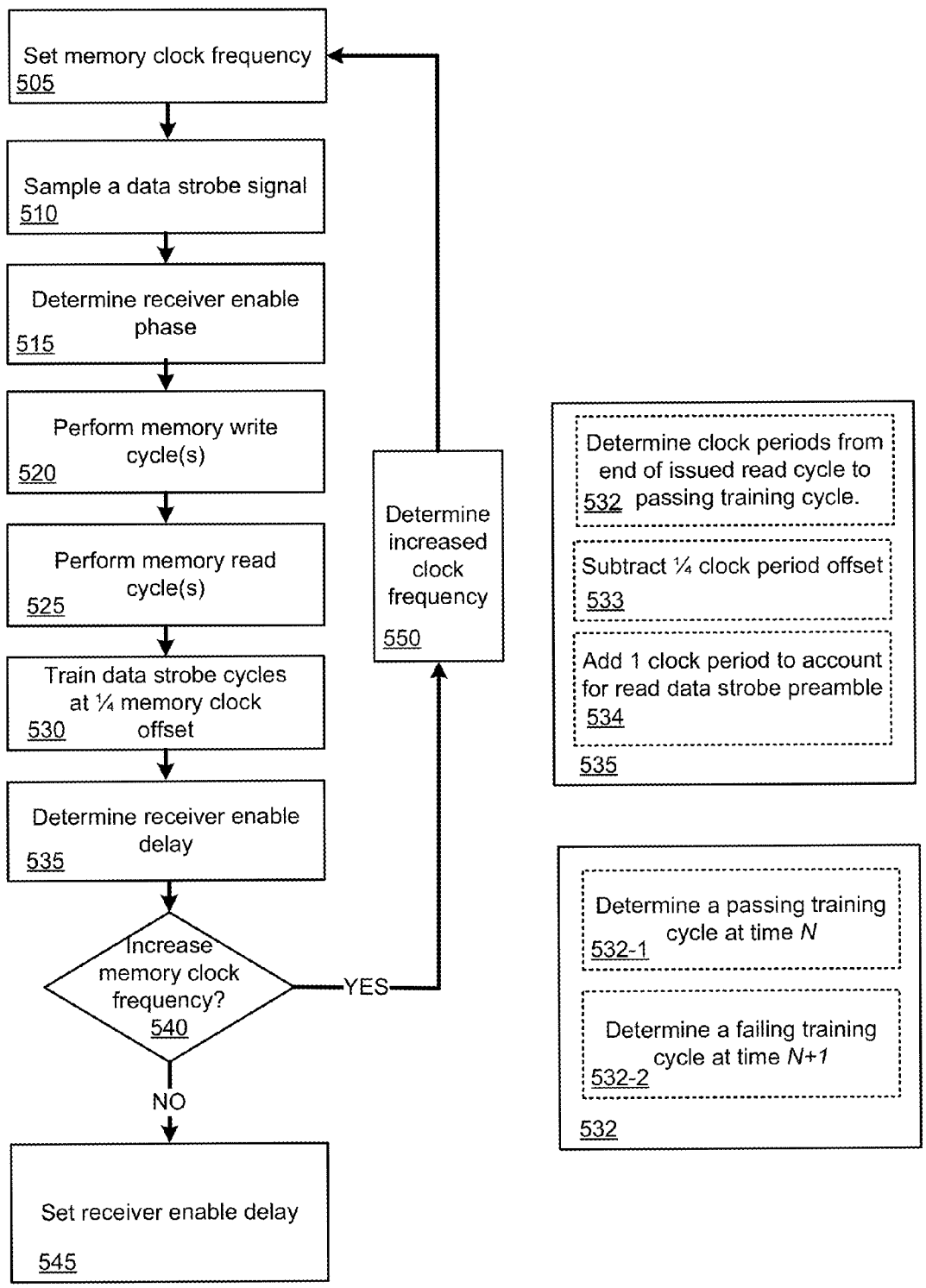
FIG. 5 illustrates a flowchart depicting DDR memory training, according to one embodiment.

Turning now to FIG. 5, an exemplary flowchart depicting one or more embodiments of a DDR memory RxEn delay training is shown. At 505, a memory clock frequency may be set. In one embodiment, the memory clock frequency may be set to any known or used DDR memory clock frequency supported by a computing device. At 510, a data strobe signal may be sampled. In one embodiment, the sampling may be performed by the PRE 136 included in the DCT 135. At 515, the receiver enable phase may be determined based at least upon the sampled data strobe signal (from 510). At 520, one or more memory write cycles may be performed using pseudo-random data or pre-determined, rich data patterns. In one embodiment, the memory write cycle(s) (520) may not need to be performed in the DRAM (e.g., 155) is able to provide a known data pattern itself. At 525, one or more memory read cycles may be performed to read the data written by the one or more memory write cycles (from 520). In one embodiment, the write and read cycles, from 520 and 525 respectively, may be initiated by a CPU, a northbridge, a GPU, a DRAM controller (DCT), and/or the like.

At 530, data strobe cycles may be trained. In one embodiment, the training may be performed using a ¼ memory clock offset from the RxEn phase determined at 515. At 535, a receiver enable (RxEn) delay may be determined. In one or more embodiments, the RxEn delay may be calculated by determining the number of clock periods from the end of the read cycle issued by a host to a passing read data strobe training cycle (at 532), subtracting the ¼ memory clock offset (at 533) and/or adding one clock period to the RxEn delay, for example, to account for the preamble of the read data strobe signal (at 534). In one embodiment, a passing read data strobe training cycle may be determined by detecting a passing training cycle (e.g., at time N) followed by a successive failing training cycle (e.g., at time N+1).

At 540, it may be determined if the memory is desired to, or is capable of, operating at a higher frequency (i.e., with a faster clock). If not, the "NO" branch is taken to 545 where the RxEn delay is set for at least a portion of the memory (e.g., at least a portion of DRAM 155). If so, the "YES" branch is taken to 55 where an increased memory clock frequency is determined in accordance with the embodiments described herein. From 550, the flow may proceed back to 505 where the determined memory clock frequency may be set, and the flow may be repeated for the determined frequency.

An exemplary advantage of the DDR memory RxEn delay training being carried out in accordance with the embodiments described herein is that a DCT to train the RxEn delay timing very accurately while supporting a wide range of signal propagation times and without extensive characterization and tuning for each configuration combination (e.g., without using RxEn seeds). Previous methods alone had either limited scope and/or accuracy. For example, a processor with an integrated DCT may be used with DIMMs of different types (e.g., UDIMM, RDIMM, and/or LRDIMM) depending on the hardware platform and/or various customer requirements. DDR3 LRDIMMs RxEn timing varies widely across DIMMs because of raw card designs and DQS/DQ interface buffering. This makes it very difficult to characterize and choose a single RxEn seed that will work across all supported LRDIMM configurations, and moreover across all supported motherboard designs. Still further, an RxEn seed may be characterized against a given server platform during boot-up during validation and/or testing. However, this value may not later be optimal for an end-user motherboard design or an OEM/ODM configuration if changes materially alter the signal propagation times. This may potentially cause training failures and/or no-boots in the system. The embodiments described herein alleviate and/or eliminate these issues.

It is contemplated that the elements as shown in FIG. 5 are not limited to the order in which they are described above. In accordance with one or more embodiments, the elements shown in FIG. 5 may be performed sequentially, in parallel, or in alternate order(s) without departing from the spirit and scope of the embodiments presented herein. For example, it is contemplated that the embodiments of DDR training described herein may include performing training on two or more data lanes in parallel. It is also contemplated that the flowcharts may be performed in whole, or in part(s), in accordance with one or more embodiments presented herein. That is, the flowcharts shown in the Figures need not perform every element described in one or more embodiments.

It is also contemplated that, in some embodiments, different kinds of hardware descriptive languages (HDL) may be used in the process of designing and manufacturing very large scale integration circuits (VLSI circuits) such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units 160, RAMs 155 (including embedded RAMs, SRAMs and/or DRAMs), compact discs, DVDs, solid state storage devices and/or the like). In one embodiment, the GDSII data (or other similar data) may be adapted to configure a manufacturing facility (e.g., through the use of mask works) to create devices capable of embodying various aspects described herein, in the instant application. In other words, in various embodiments, this GDSII data (or other similar data) may be programmed into a computer 100, processor 125/140 or controller, which may then control, in whole or part, the operation of a semiconductor manufacturing facility (or fab) to create semiconductor products and devices. For example, in one embodiment, silicon wafers containing one or more CPUs 140, GPUs 125, DCTs 135, hardware state machines and/or algorithms (not shown), caches 130, and/or the like may be created using the GDSII data (or other similar data).

It should also be noted that while various embodiments may be described in terms of DRAM controllers (DCTs) and CPUs, it is contemplated that the embodiments described herein may have a wide range of applicability, for example, in various systems that include DDR memory in general (e.g., DDR2/DDR3), as would be apparent to one of skill in the art having the benefit of this disclosure. For example, the embodiments described herein may be used in systems that implement DDR memory receiver enable training using a specific hardware circuit and/or state machines in addition to, or alternatively to, DCT/CPU implementations. Similarly, systems that perform signaling using protocols in addition to, or alternatively to, DDR memory signaling are contemplated as being within the scope of the embodiments described herein.

The particular embodiments disclosed above are illustrative only, as the embodiments herein may be modified and practiced in different but equivalent manners apparent to those skilled in the art having the benefit of the teachings herein. Furthermore, no limitations are intended to the details of construction or design as shown herein, other than as described in the claims below. It is therefore evident that the particular embodiments disclosed above may be altered or modified and all such variations are considered within the scope of the claimed invention.

Accordingly, the protection sought herein is as set forth in the claims below.

What is claimed:

1. A method, comprising:
   sampling a data strobe signal for a plurality of memory cycles;
   determining a receiver enable phase based upon the sampled data strobe signal;
   performing at least one memory write cycle and at least one memory read cycle to read data written by the at least one memory write cycle at a selected memory clock frequency;
   training at least one read data strobe cycle associated with the memory read cycle, wherein training is performed at a one-quarter memory clock cycle offset from an optimal receiver enable delay phase; and
   determining a correct receiver enable delay in response to a successful read data strobe training cycle.

2. The method of claim 1, wherein determining the correct receiver enable delay further comprises:
   determining a number of memory clock periods from the end of the performed memory read cycle to the successful read data strobe training cycle;
   determining a difference of memory clock cycles by subtracting the one-quarter memory clock cycle offset from the determined number of memory clock periods; and
   setting the correct receiver enable delay as the sum of one clock cycle and the difference of memory clock cycles.

3. The method of claim 2, further comprising:
   selecting at least one additional memory clock frequency; and
   performing the sampling a data strobe signal for a plurality of cycles, the determining a receiver enable phase, the performing at least one write cycle to a memory and at least one read cycle to read data written to the memory by the write cycle, the training at least one read data strobe cycle, the determining a correct receiver enable delay, the determining a number of clock periods, the determining a difference of clock cycles, and the setting the correct receiver enable delay for each at least one additional memory clock frequency starting with the lowest frequency and ending with the highest frequency.

4. The method of claim 2, wherein performing at least one write cycle to a memory and at least one read cycle to read data written to the memory by the write cycle comprises at least one of:
   writing half of a cache line of data and reading the half of a cache line of data; and
   writing a cache line of data and reading the cache line of data.

5. The method of claim 2, wherein the at least one memory write cycle comprises at least one of a pseudo-random bit sequence or a pre-determined, rich bit sequence.

6. The method of claim 2, further comprising at least one of:
   determining a read data strobe delay, comprising:
      setting the read data strobe delay to an optimal value and performing at least one of training at least one read data strobe cycle based on the correct receiver enable delay or training at least one read data strobe cycle at about the same time as determining the correct receiver enable delay; and
      setting a correct read data strobe delay in response to a successful read data strobe training cycle;
   determining a write data delay, comprising:
      setting the write data delay to an optimal value and performing at least one of training at least one write data cycle based on the correct receiver enable delay or training at least one write data cycle at about the same time as determining the correct receiver enable delay; and
      setting a correct write data delay in response to a successful write data training cycle; and
   determining a write data strobe delay, comprising:
      setting the write data strobe delay to an optimal value and performing at least one of training at least one write data strobe cycle based on the correct receiver enable delay or training at least one write data strobe cycle at about the same time as determining the correct receiver enable delay; and
      setting a correct write data strobe delay in response to a successful write data strobe training cycle.

7. The method of claim 6, further comprising:
   determining that no read data strobe training cycle have successfully completed;
   performing at least one of training a subsequent read data strobe cycle of the at least one read data strobe cycle in response to a failed read data strobe training cycle or training a subsequent write data cycle of the at least one write data cycle in response to a failed write data training cycle; and
   determining the correct receiver enable delay in response to a successful training cycle.

8. The method of claim 2, wherein the sampling a data strobe signal for a plurality of cycles, the determining a receiver enable phase, the performing at least one write cycle to a memory and at least one read cycle to read data written to the memory by the write cycle, the training at least one read data strobe cycle, the determining a correct receiver enable delay, the determining a number of clock periods, the determining a difference of clock cycles, and the setting the correct receiver enable delay is performed on at least one of a bit-basis, a byte-basis, a rank-basis, a channel-basis or a bus-basis.

9. The method of claim 1, wherein a successful read data strobe training cycle is a passing read data strobe training cycle that is followed by a successive, failing read data strobe training cycle.

10. The method of claim 1, wherein the at least one memory write cycle and the at least one memory read cycle are each initiated by a DRAM controller, and each target a double data rate (DDR) memory.

11. A non-transitory, computer-readable storage device encoded with data that, when executed by a processing device, adapts the processing device to perform a method, comprising:
   sampling a data strobe signal for a plurality of memory cycles;
   determining a receiver enable phase based upon the sampled data strobe signal;
   performing at least one memory write cycle and at least one memory read cycle to read data written by the at least one memory write cycle at a selected memory clock frequency;
   training at least one read data strobe cycle associated with the memory read cycle, wherein training is performed at a one-quarter memory clock cycle offset from an optimal receiver enable delay phase; and
   determining a correct receiver enable delay in response to a successful read data strobe training cycle.

12. The non-transitory, computer-readable storage device encoded with data that, when executed by a processing device, adapts the processing device to perform a method as in claim 11, wherein determining the correct receiver enable delay further comprises:
   determining a number of memory clock periods from the end of the performed memory read cycle to the successful read data strobe training cycle;
   determining a difference of memory clock cycles by subtracting the one-quarter memory clock cycle offset from the determined number of memory clock periods; and
   setting the correct receiver enable delay as the sum of one clock cycle and the difference of memory clock cycles.

13. The non-transitory, computer-readable storage device encoded with data that, when executed by a processing device, adapts the processing device to perform a method as in claim 12, further comprising:
   selecting at least one additional memory clock frequency; and
   performing the sampling a data strobe signal for a plurality of cycles, the determining a receiver enable phase, the performing at least one write cycle to a memory and at least one read cycle to read data written to the memory by the write cycle, the training at least one read data strobe cycle, the determining a correct receiver enable delay, the determining a number of clock periods, the determining a difference of clock cycles, and the setting the correct receiver enable delay for each at least one additional memory clock frequency starting with the lowest frequency and ending with the highest frequency.

14. The non-transitory, computer-readable storage device encoded with data that, when executed by a processing device, adapts the processing device to perform a method as in claim 12, wherein performing at least one write cycle to a memory and at least one read cycle to read data written to the memory by the write cycle comprises at least one of:
   writing half of a cache line of data and reading the half of a cache line of data; and
   writing a cache line of data and reading the cache line of data.

15. The non-transitory, computer-readable storage device encoded with data that, when executed by a processing device, adapts the processing device to perform a method as in claim 12, wherein the at least one memory write cycle comprises at least one of a pseudo-random bit sequence or a pre-determined, rich bit sequence.

16. The non-transitory, computer-readable storage device encoded with data that, when executed by a processing device, adapts the processing device to perform a method as in claim 12, further comprising at least one of:
   determining a read data strobe delay, comprising:
      setting the read data strobe delay to an optimal value and performing at least one of training at least one read data strobe cycle based on the correct receiver enable delay or training at least one read data strobe cycle at about the same time as determining the correct receiver enable delay; and
      setting a correct read data strobe delay in response to a successful read data strobe training cycle;
   determining a write data delay, comprising:
      setting the write data delay to an optimal value and performing at least one of training at least one write data cycle based on the correct receiver enable delay or training at least one write data cycle at about the same time as determining the correct receiver enable delay; and
      setting a correct write data delay in response to a successful write data training cycle; and
   determining a write data strobe delay, comprising:
      setting the write data strobe delay to an optimal value and performing at least one of training at least one write data strobe cycle based on the correct receiver enable delay or training at least one write data strobe cycle at about the same time as determining the correct receiver enable delay; and
      setting a correct write data strobe delay in response to a successful write data strobe training cycle.

17. The non-transitory, computer-readable storage device encoded with data that, when executed by a processing device, adapts the processing device to perform a method as in claim 16, further comprising:
   determining that no read data strobe training cycle have successfully completed;
   performing at least one of training a subsequent read data strobe cycle of the at least one read data strobe cycle in response to a failed read data strobe training cycle or training a subsequent write data cycle of the at least one write data cycle in response to a failed write data training cycle; and
   determining the correct receiver enable delay in response to a successful training cycle.

18. The non-transitory, computer-readable storage device encoded with data that, when executed by a processing device, adapts the processing device to perform a method as in claim 12, wherein the sampling a data strobe signal for a plurality of cycles, the determining a receiver enable phase, the performing at least one write cycle to a memory and at least one read cycle to read data written to the memory by the write cycle, the training at least one read data strobe cycle, the determining a correct receiver enable delay, the determining a number of clock periods, the determining a difference of clock cycles, and the setting the correct receiver enable delay is performed on at least one of a bit-basis, a byte-basis, a rank-basis, a channel-basis or a bus-basis.

19. The non-transitory, computer-readable storage device encoded with data that, when executed by a processing device, adapts the processing device to perform a method as in claim 11, wherein a successful read data strobe training cycle is a passing read data strobe training cycle that is followed by a successive, failing read data strobe training cycle.

20. The non-transitory, computer-readable storage device encoded with data that, when executed by a processing device, adapts the processing device to perform a method as in claim 11, wherein the at least one memory write cycle and the at least one memory read cycle are each initiated by a DRAM controller, and each target a double data rate (DDR) memory.

21. An apparatus, comprising:
   at least one communication interface portion communicatively coupleable to at least one memory portion and to a processing device; and
   a first circuit portion, communicatively coupled to the at least one communication interface portion, and configured to:
      monitor a plurality of memory cycles on the at least one communication interface portion;
      determine a receiver enable cycle phase; and
      train a receiver enable cycle without using an estimate of a receiver enable cycle delay.

22. The apparatus of claim 21, wherein the apparatus further comprises:
   a second circuit portion, communicatively coupled to the first circuit portion, and configured to determine a receiver enable cycle delay based at least upon the determined receiver enable phase.

23. The apparatus of claim 22, wherein the second circuit portion is configured to determine the receiver enable cycle delay by:
   determining a number of memory clock periods from the end of a performed memory read cycle to a successful read data strobe training cycle;
   determining a difference of memory clock cycles by subtracting a one-quarter memory clock cycle offset from the determined number of memory clock periods; and
   setting a correct receiver enable delay as the sum of one clock cycle and the difference of memory clock cycles.

24. The apparatus of claim 23, wherein the first circuit portion is configured to monitor the plurality of memory cycles, determine the receiver enable cycle phase and train the receiver enable cycle on at least one of a bit-basis, a byte-basis, a rank-basis, a channel-basis or a bus-basis; and
   wherein the second circuit portion is configured to determine a receiver enable cycle delay on at least one of a bit-basis, a byte-basis, a rank-basis, a channel-basis or a bus-basis.

\* \* \* \* \*